(12) United States Patent
Ji et al.

(10) Patent No.: US 10,663,628 B1
(45) Date of Patent: May 26, 2020

(54) CLOAKING DEVICES WITH FRESNEL MIRRORS AND PLANE MIRRORS AND VEHICLES COMPRISING THE SAME

(71) Applicant: Toyota Motor Engineering & Manufacturing North America, Inc., Plano, TX (US)

(72) Inventors: Chengang Ji, Ann Arbor, MI (US); Kyu-Tae Lee, Ann Arbor, MI (US); Debasish Banerjee, Ann Arbor, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 183 days.

(21) Appl. No.: 16/005,153

(22) Filed: Jun. 11, 2018

(51) Int. Cl.
| | |
|---|---|
| *G02B 3/08* | (2006.01) |
| *G02B 1/04* | (2006.01) |
| *F24S 23/30* | (2018.01) |
| *H01L 31/054* | (2014.01) |

(52) U.S. Cl.
CPC ............... *G02B 3/08* (2013.01); *G02B 1/041* (2013.01); *F24S 23/31* (2018.05); *H01L 31/0543* (2014.12); *Y02E 10/52* (2013.01)

(58) Field of Classification Search
CPC . G02B 3/08; G02B 1/041; Y02E 10/52; F24S 23/31; H01L 31/0543
USPC ...................................................... 359/742
See application file for complete search history.

(56) References Cited

U.S. PATENT DOCUMENTS

| 9,557,547 B2 | 1/2017 | Choi et al. |
| 2003/0047666 A1 | 3/2003 | Alden |
| 2017/0212285 A1 | 7/2017 | Arbabi et al. |

FOREIGN PATENT DOCUMENTS

| EP | 1258846 B1 | 12/2004 |
| TW | 201715272 A | 5/2017 |

OTHER PUBLICATIONS

U.S. Appl. No. 15/863,353, filed Jan. 5, 2018; Inventors: Chengang Ji et al.

*Primary Examiner* — Mohammed A Hasan
(74) *Attorney, Agent, or Firm* — Dinsmore & Shohl LLP

(57) ABSTRACT

A cloaking device includes an object-side, an image-side, a cloaked region between the object-side and the image-side, and a reference optical axis extending from the object-side to the image-side. A plurality of object-side Fresnel mirrors, a plurality of image-side Fresnel mirrors and a planar reflection boundary positioned between the plurality of object-side Fresnel mirrors and the plurality of image-side Fresnel mirrors are included. Each of the Fresnel mirrors comprises an outward facing reflection surface. Light from an object positioned on the object-side of the cloaking device and obscured by the cloaked region is redirected around the cloaked region by the plurality of object-side Fresnel mirrors, the planar reflection boundary and the plurality of image-side Fresnel mirrors to form an image of the object on the image-side of the cloaking device such that the light from the object appears to pass through the cloaked region.

20 Claims, 7 Drawing Sheets

CLOAKING DEVICES WITH FRESNEL MIRRORS AND PLANE MIRRORS AND VEHICLES COMPRISING THE SAME

TECHNICAL FIELD

The present specification generally relates to apparatuses and methods for making an object appear transparent and, more specifically, to cloaking devices for pillars of vehicles and methods for making pillars of vehicles appear transparent.

BACKGROUND

Studies on cloaking devices that appear to make a pillar of a vehicle transparent have been published. Such studies disclose the use of metamaterials or the use of video cameras in combination with a display screen to allow an occupant of a vehicle to ostensibly "see" through the vehicle pillar, thereby reducing blind spots in the vehicle. However, metamaterials and video technology use complicated material designs and equipment.

Accordingly, a need exists for alternative devices that appear to make a pillar of a vehicle transparent.

SUMMARY

In one embodiment, a cloaking device includes an object-side, an image-side, a cloaked region between the object-side and the image-side, and a reference optical axis extending from the object-side to the image-side. A plurality of object-side Fresnel mirrors, a plurality of image-side Fresnel mirrors and a planar reflection boundary positioned between the plurality of object-side Fresnel mirrors and the plurality of image-side Fresnel mirrors are included. The plurality of object-side Fresnel mirrors and the plurality of image-side Fresnel mirrors each comprise an outward facing curved reflection surface and the planar reflection boundary comprises an inward facing mirror surface oriented parallel to the reference optical axis. The plurality of object-side Fresnel mirrors may be disposed within an object-side transparent casing and the plurality of image-side Fresnel mirrors may be disposed within an image-side transparent casing. Light from an object positioned on the object-side of the cloaking device and obscured by the cloaked region is redirected around the cloaked region by the plurality of object-side Fresnel mirrors, the planar reflection boundary and the plurality of image-side Fresnel mirrors. The redirection of the light around the cloaked region provides an image of the object on the image-side of the cloaking device such that the light from the object appears to pass through the cloaked region.

In embodiments, the outward facing curved reflection surface for each of the plurality of object-side Fresnel mirrors and each of the plurality of image-side Fresnel mirrors may be an outward facing parabolic reflection surface. Also, the inward facing mirror surface of the planar reflection boundary is positioned at a focal line of the plurality of object-side Fresnel mirrors. The plurality of object-side Fresnel mirrors are oriented to focus light from the object positioned on the object-side of the cloaking device onto the inward facing mirror surface of the planar reflection boundary and the inward facing mirror surface of the planar reflection boundary is oriented to reflect light from the plurality of object-side Fresnel mirrors to the plurality of image-side Fresnel mirrors. Light reflected from the inward facing mirror surface of the planar reflection boundary is diverging light and the plurality of image-side Fresnel mirrors are oriented to focus the diverging light to form the image of the object on the image-side of the cloaking device. Accordingly, light from the object on the object-side of the cloaking device is redirected around the cloaked region via an optical path: object—outward facing curved reflection surfaces of the plurality of object-side Fresnel mirrors—inward facing mirror surface of the planar reflection boundary—outward facing curved reflection surfaces of the plurality of image-side Fresnel mirrors—image.

In some embodiments, the plurality of object-side Fresnel mirrors may comprise a first set of object-side Fresnel mirrors positioned on a first side of the reference optical axis and a second set of object-side Fresnel mirrors positioned on a second side of the reference optical axis opposite the first side. In such embodiments, the plurality of image-side Fresnel mirrors may comprise a first set of image-side Fresnel mirrors on the first side of the reference optical axis and a second set of image-side Fresnel mirrors positioned on the second side of the reference optical axis. The planar reflection boundary comprises a pair of planar reflection boundaries with a first planar reflection boundary positioned between the first set of object-side Fresnel mirrors and the first set of image-side Fresnel mirrors positioned on the first side of the reference optical axis, and a second planar reflection boundary positioned between the second set of object-side Fresnel mirrors and the second set of image-side Fresnel mirrors positioned on the second side of the reference optical axis. The first set of object-side Fresnel mirrors may be disposed within a first object-side transparent casing, the second set of object-side Fresnel mirrors may be disposed within a second object-side transparent casing, the first set of image-side Fresnel mirrors may be disposed within a first image-side transparent casing, and the second set of image-side Fresnel mirrors may be disposed within a second image-side transparent casing. Light from the object positioned on the object-side of the cloaking device and obscured by the cloaked region is redirected around the cloaked region by the first and second sets of object-side Fresnel mirrors, the first and second planar reflection boundaries, and the first and second sets of image-side Fresnel mirrors to form the image of the object on the image-side of the cloaking device such that the light from the object appears to pass through the cloaked region.

In another embodiment, a cloaking device assembly includes an object-side, an image-side, a cloaked region, a cloaked article positioned within the cloaked region, and a reference optical axis extending from the object-side to the image-side. A plurality of object-side Fresnel mirrors are positioned on the object-side and comprise a first set of object-side Fresnel mirrors positioned on a first side of the reference optical axis and a second set of object-side Fresnel mirrors positioned on a second side of the reference optical axis opposite the first side. Also, a plurality of image-side Fresnel mirrors are positioned on the image-side and comprise a first set of image-side Fresnel mirrors positioned on the first side of the reference optical axis and a second set of image-side Fresnel mirrors positioned on the second side of the reference optical axis opposite the first side. Each of the plurality of object-side Fresnel mirrors and each of the plurality of image-side Fresnel mirrors may comprise an outward facing curved reflection surface, for example, an outward facing parabolic reflection surface. Also, each of the plurality of object-side Fresnel mirrors may comprise a distal edge aligned on a plane on the object-side and each of the plurality of image-side Fresnel mirrors may comprise a distal edge aligned on a plane on the image-side. A pair of planar reflection boundaries comprising a first planar reflection boundary and a second planar reflection boundary may be included. The first planar reflection boundary may be positioned between the first set of object-side Fresnel mirrors and the first set of image-side Fresnel mirrors positioned on the first side of the reference optical axis. The second planar reflection boundary may be positioned between the second set of object-side Fresnel mirrors and the second set of image-side Fresnel mirrors positioned on the second side of the reference optical axis. Each of the pair of planar reflection boundaries may comprise an inward facing mirror surface oriented parallel to the reference optical axis. Light from an object positioned on the object-side of the cloaking device assembly and obscured by the cloaked region is redirected around the cloaked article by the plurality of object-side Fresnel mirrors, the pair of planar reflection boundaries, and the plurality of image-side Fresnel mirrors to form an image of the object on the image-side of the cloaking device assembly such that the light from the object appears to pass through the cloaked article. Particularly, light from the object positioned on the object-side of the cloaking device assembly may propagate to the image-side to form the image via an optical path: object—plurality of object-side Fresnel mirrors—inward facing mirror surfaces of the pair of planar reflection boundaries—plurality of image-side Fresnel mirrors—image.

In embodiments, the first set of object-side Fresnel mirrors may be disposed within a first object-side transparent casing, the second set of object-side Fresnel mirrors may be disposed within a second object-side transparent casing, the first set of image-side Fresnel mirrors may be disposed within a first image-side transparent casing, and the second set of image-side Fresnel mirrors may be disposed within a second image-side transparent casing. In such embodiments, each of the object-side casings and each of the image-side casings may comprise a proximal surface and a distal surface. Light from the object positioned on the object-side of the cloaking device assembly may propagate to the image-side to form the image via an optical path: object—distal surfaces of the first and second object-side casings—outward facing curved reflection surfaces of the first and second set of object-side Fresnel mirrors—proximal surfaces of the first and second object-side casings—inward facing mirror surfaces of the pair of planar reflection boundaries—proximal surfaces of the first and second image-side casings—outward facing curved reflection surfaces of the first and second set of image-side Fresnel mirrors—distal surfaces of the first and second image-side casings—image.

In another embodiment, a vehicle includes an A-pillar with a cloaking device positioned on the A-pillar. The cloaking device includes an object-side, an image-side, a cloaked region and a reference optical axis extending from the object-side to the image-side. The object-side is positioned on an exterior of the vehicle and the image-side is positioned within an interior of the vehicle. A plurality of object-side Fresnel mirrors are positioned on the object-side, a plurality of image-side Fresnel mirrors are positioned on the image-side, and each of the plurality of object-side Fresnel mirrors and each of the plurality of image-side Fresnel mirrors comprise an outward facing curved reflection surface, for example, an outward facing parabolic reflection surface. A planar reflection boundary may be positioned between the plurality of object-side Fresnel mirrors and the plurality of image-side Fresnel mirrors, and the planar reflection boundary may comprise an inward facing mirror surface oriented parallel with the reference optical axis. In embodiments, the planar reflection boundary is positioned at a focal line of the plurality of object-side Fresnel mirrors. Light from an object positioned on the object-side of the cloaking device and obscured by the cloaked region is redirected around the A-pillar via reflection of the light by the plurality of object-side Fresnel mirrors onto the planar reflection boundary, reflection of the light by the planar reflection boundary onto the plurality of image-side Fresnel mirrors, and reflection of the light by the plurality of image-side Fresnel mirrors to form an image of the object on the image-side of the cloaking device such that the light from the object appears to pass through the cloaked region.

In some embodiments, the plurality of object-side Fresnel mirrors are disposed within an object-side transparent casing and the plurality of image-side Fresnel mirrors are disposed within an image-side transparent casing. The object-side transparent casing and the image-side transparent casing each comprise a proximal surface and a distal surface. In such embodiments, light from the object positioned on the exterior of the vehicle propagates to within the interior of the vehicle to form the image via an optical path: object—distal surface of the object-side transparent casing—plurality of object-side Fresnel mirrors—proximal surface of the object-side transparent casing—inward facing mirror surfaces of the pair of planar reflection boundaries—proximal surface of the image-side transparent casing—plurality of image-side Fresnel mirrors—distal surface of the image-side transparent casing—image.

These and additional features provided by the embodiments described herein will be more fully understood in view of the following detailed description in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

According to one or more embodiments described herein, a cloaking device may generally comprise a plurality of Fresnel mirrors (also referred to herein simply as "Fresnel mirrors") and a planar mirror which direct incoming light around a cloaked region. The cloaking devices described herein may utilize Fresnel mirrors with curved outward facing reflection surfaces in combination with a planar mirror to focus, reflect, diverge and re-focus light from an object. Cloaking devices may be used to cloak vehicle articles such as vehicle A-pillars, B-pillars, C-pillars, D-pillars, etc., and remove a "blind spot" caused by the vehicle article. A blind spot refers to a region of the vehicle where an occupant's view may be obstructed. The utilization of the Fresnel mirrors and planar mirror allows a driver to perceive an image which, if not for the cloaking device, would be obstructed by a pillar of the vehicle. Various embodiments of cloaking devices and methods for using the same will be described in further detail herein with specific reference to the appended drawings.

Figure 1:
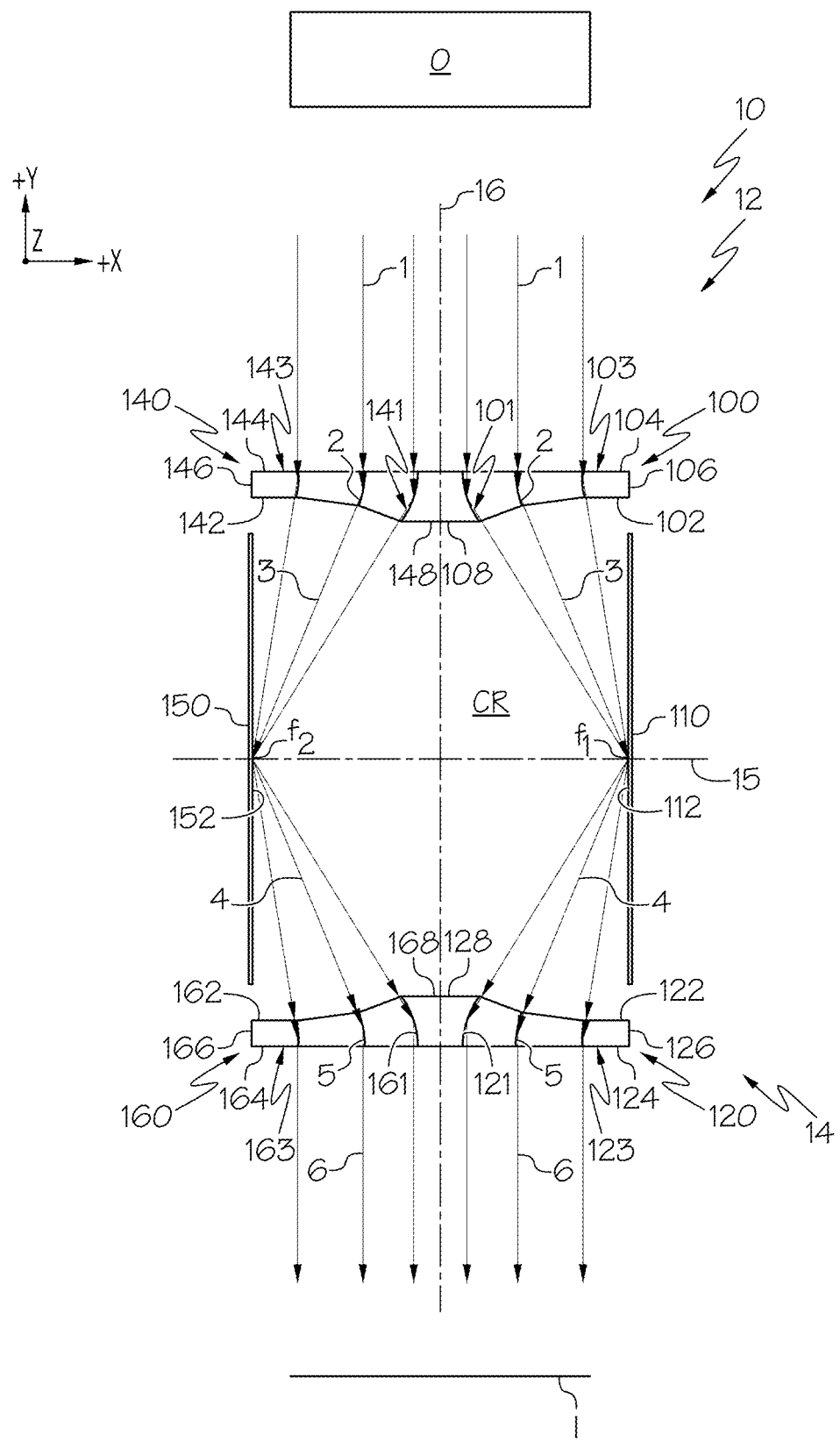
FIG. 1 schematically depicts a top view of a cloaking device according to one or more embodiments disclosed and described herein.
Figure 2A:
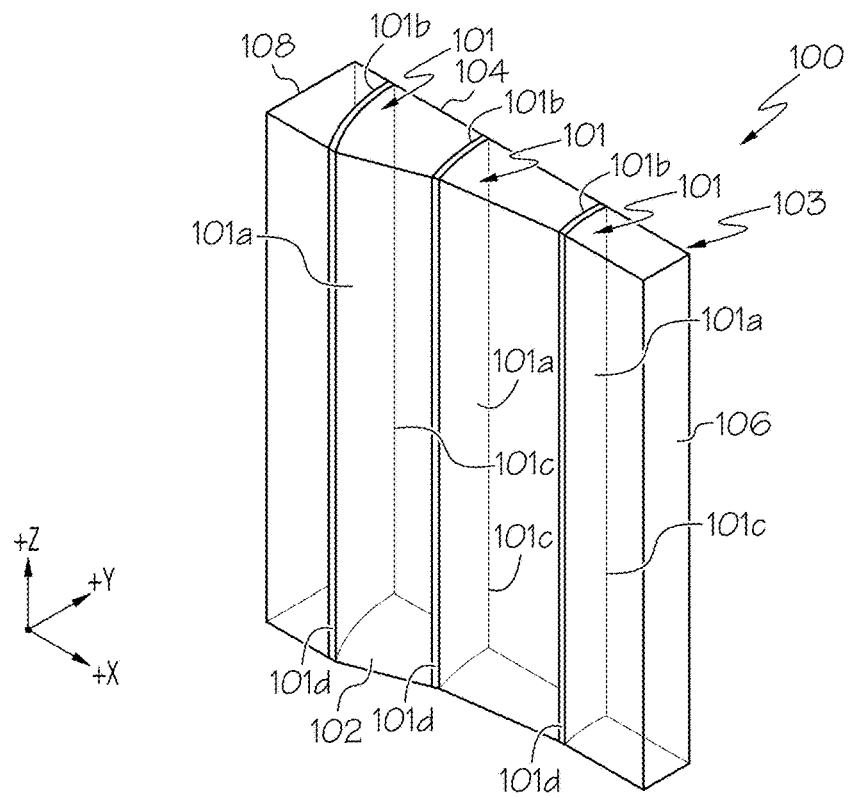
FIG. 2A schematically depicts a first Fresnel mirror assembly for a cloaking device according to one or more embodiments disclosed and described herein.
Figure 2B:
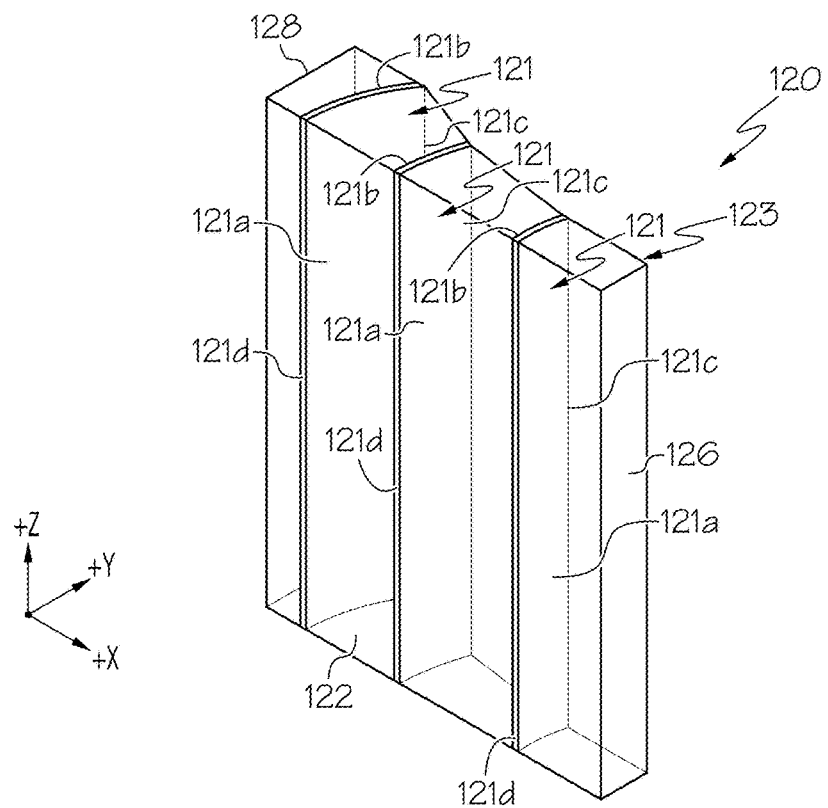
FIG. 2B schematically depicts a second Fresnel mirror assembly for a cloaking device according to one or more embodiments disclosed and described herein.
Figure 2C:
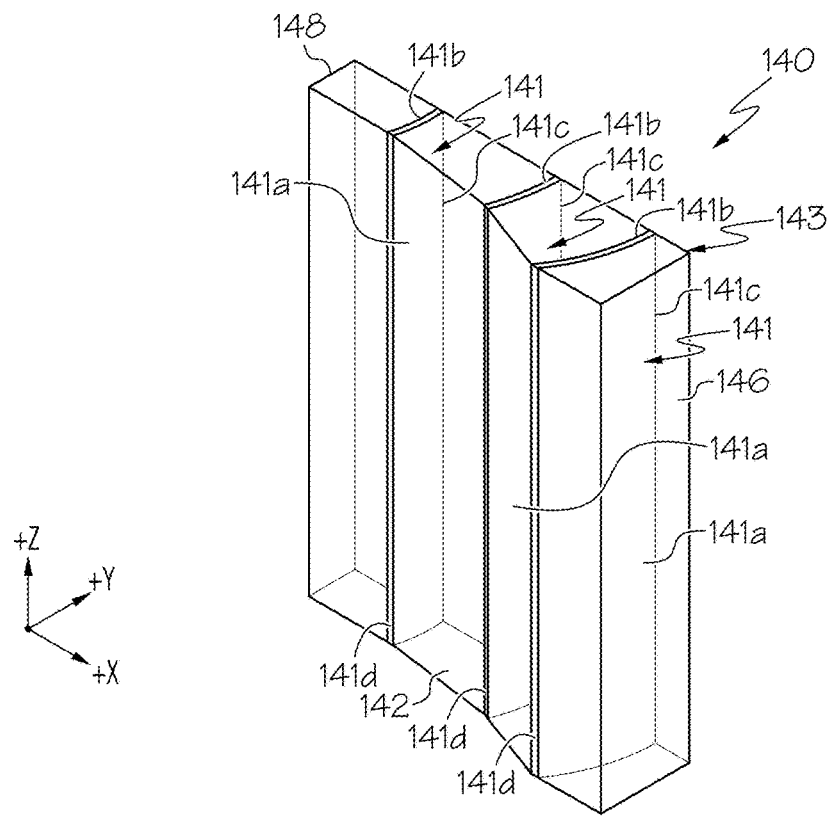
FIG. 2C schematically depicts a third Fresnel mirror assembly for a cloaking device according to one or more embodiments disclosed and described herein.
Figure 2D:
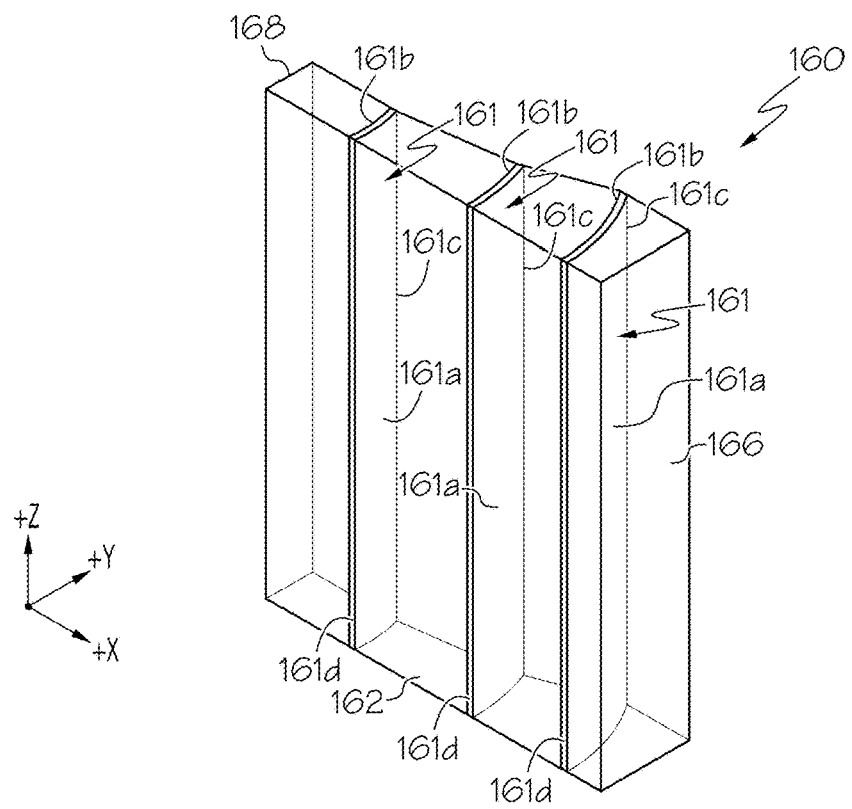
FIG. 2D schematically depicts a fourth Fresnel mirror assembly for a cloaking device according to one or more embodiments disclosed and described herein.

FIG. 1 generally depicts one embodiment of a cloaking device. The cloaking device includes an object-side, an image-side, and a cloaked region at least partially bounded by a plurality of object-side Fresnel mirrors (also referred to herein simply as "object-side Fresnel mirrors"), a planar reflection boundary, and a plurality of image-side Fresnel mirrors (also referred to herein simply as "object-side Fresnel mirrors"). The planar reflection boundary may be positioned between the object-side Fresnel mirrors and the image-side Fresnel mirrors. The object-side Fresnel mirrors and the image-side Fresnel mirrors each have a distal edge, a proximal edge, and an outward facing reflection surface extending between the distal edge and the proximal edge. The object-side Fresnel mirrors are oriented to reflect and focus incident light from an object positioned on an object-side of the cloaking device onto the planar reflection boundary. The planar reflection boundary is oriented to reflect and diverge the focused incident light from the object-side Fresnel mirrors onto the image-side Fresnel mirrors. The image-side Fresnel mirrors are oriented to focus the diverging incident light from the planar reflection boundary and provide an image on the image-side of the cloaking device.

As used herein, the phrase "Fresnel mirrors" refers to a plurality of curved reflection surfaces each comprising a distal edge aligned on a plane such that the distal edges are aligned parallel to each other on the plane. As used herein, the phrase "distal" refers to a surface, end or edge of a component positioned proximal to a cloaked region relative to a proximal surface, end or edge of the component and the phrase "proximal" refers to a surface, end or edge of a component positioned proximal to a cloaked region relative to a distal surface, end or edge of the component. The term "reflection surface" as used herein refers to a surface that reflects at least 60% of light incident on the surface, e.g., a surface that reflects at least 70%, 80% or 90% of incident light. The terms "boundaries" and "boundary" refer to a physical surface. As used herein the, the term "outward facing surface" refers to a surface facing away or distal from a reference optical axis extending from an object-side to an image-side of a cloaking device. The terms "diverges" and "diverging" and the phrase "diverging light" as used herein refer to light rays propagating away from each other. Accordingly, a beam of diverging light has an increasing cross-sectional area with increasing distance traveled by the beam of diverging light.

Still referring to FIG. 1, embodiments of a cloaking device include a cloaking device assembly 10 with an object-side 12, an image-side 14, and four assemblies of Fresnel mirrors 100, 120, 140, 160 (referred to herein as "Fresnel mirror assemblies 100, 120, 140, 160"). The object-side 12 is positioned above (+Y direction) a bisecting axis 15 and the image-side 14 is positioned below (−Y direction) the bisecting axis 15. That is, the bisecting axis 15 extends between and delineates the object-side 12 and the image-side 14. A cloaked region CR is positioned between the Fresnel mirror assemblies 100, 140 and Fresnel mirror assemblies 120, 160. Each of the four Fresnel mirror assemblies 100, 120, 140, 160 may comprise a plurality of Fresnel mirrors 101, 121, 141, 161 (FIGS. 2A-2D), and the Fresnel mirrors 101, 121, 141, 161 may be disposed within a transparent casing, a frame, and the like. That is, in some embodiments, the Fresnel mirrors 101, 121, 141, 161 may be encapsulated within a casing 103, 123, 143, 163 (FIGS. 2A-2D), respectively, formed from a transparent glass, a transparent polymer, etc. In other embodiments, the Fresnel mirrors 101, 121, 141, 161 may be positioned and held within a frame (now shown) without being encapsulated within a transparent casing. In still other embodiments, the Fresnel mirrors 101, 121, 141, 161 may be encapsulated within the casing 103, 123, 143, 163, respectively, and positioned and held within a frame (not shown). The four Fresnel mirror assemblies 100, 120, 140, 160 include a proximal surface 102, 122, 142, 162, a distal surface 104, 124, 144, 164, a first end 106, 126, 146, 166, and a second end 108, 128, 148, 168, respectively. The proximal surfaces 102, 122, 142, 162 and the distal surfaces 104, 124, 144, 164 extend between the first ends 106, 126, 146, 166 and the second ends 108, 128, 148, 168, respectively. Accordingly, the four Fresnel mirror assemblies 100, 120, 140, 160 each have a length along the X-axis, a thickness along the Y-axis and a height along the Z-axis of the coordinate axes shown in the figures. That is, the X-axis shown in the figures extends along a length of the four Fresnel mirror assemblies 100, 120, 140, 160, the Y-axis shown in the figures extends along a thickness of the four Fresnel mirror assemblies 100, 120, 140, 160, and the Z-axis shown in the figures extends along a height of the four Fresnel mirror assemblies 100, 120, 140, 160.

The two Fresnel mirror assemblies 100, 140 with the Fresnel mirrors 101, 141 may be positioned on the object-side 12 of the cloaking device assembly 10 to face an object 'O' and may be referred to herein as object-side Fresnel mirror assemblies 100, 140 and object-side Fresnel mirrors 101, 141, respectively. The two Fresnel mirror assemblies 120, 160 with the Fresnel mirrors 121, 161 may be positioned on the image-side 14 of the cloaking device assembly 10 to provide an image 'I' formed by the cloaking device assembly 10 and may be referred to herein as image-side assemblies of Fresnel mirrors 120, 160 and image-side Fresnel mirrors 121, 161, respectively. The two Fresnel mirror assemblies 100, 120 with the Fresnel mirrors 101, 121 may be positioned on a first side (+X direction) of a reference optical axis 16 extending from the object-side 12 to the image-side 14 and may be referred to herein as a first object-side Fresnel mirror assembly 100 with first object-side Fresnel mirrors 101 and a first image-side Fresnel mirror assembly 120 with first image-side Fresnel mirrors 121. The two Fresnel mirror assemblies 140, 160 with the Fresnel mirrors 141, 161 may be positioned on a second side (−X direction) of the reference optical axis 16 opposite the first side and may be referred to herein as a second object-side Fresnel mirror assembly 140 with second object-side Fresnel mirrors 141 and a second image-side Fresnel mirror assembly 160 with second image-side Fresnel mirrors 161.

Referring now to FIGS. 2A-2D, isolated views of the Fresnel mirror assemblies 100, 120, 140, 160 with the plurality of Fresnel mirrors 101, 121, 141, 161 are schematically depicted. Each of the Fresnel mirrors 101, 121, 141, 161 has an outward facing reflection surface 101a, 121a, 141a, 161a, an inward facing surface 101b, 121b, 141b, 161b, a distal edge 101c, 121c, 141c, 161c, and a proximal edge 101d, 121d, 141d, 161d, respectively. As used herein, the phrase "outward facing" refers to a surface of a component facing away or positioned distal from the reference optical axis 16 relative to an inward facing surface of the component and the phrase "inward facing" refers to a surface of a component facing towards or positioned proximal to the reference optical axis 16 relative to an outward facing surface of the component. The outward facing reflection surfaces 101a, 121a, 141a, 161a, and the inward facing surfaces 101b, 121b, 141b, 161b, extend between the distal edges 101c, 121c, 141c, 161c, and the proximal edges 101d, 121d, 141d, 161d, respectively. Also the distal edges 101c, 121c, 141c, 161c, of each of the Fresnel mirrors 101, 121, 141, 161, respectively, are aligned parallel to each other along a plane. In embodiments, the distal edges 101c, 121c, 141c, 161c, of each of the Fresnel mirrors 101, 121, 141, 161, respectively, may be aligned along a plane defined by the distal surface 104, 124, 144, 164, of the casing 103, 123, 143, 163, respectively. In other embodiments, the distal edges 101c, 121c, 141c, 161c, of each of the Fresnel mirrors 101, 121, 141, 161, respectively, may be aligned along a plane spaced inwardly (−Y direction) from the distal surface 104, 124, 144, 164, of the casing 103, 123, 143, 163, respectively. Each of the Fresnel mirrors 101, 121, 141, 161 has a thickness between the outward facing reflection surface 101a, 121a, 141a, 161a and the inward facing surface 101b, 121b, 141b, 161b, respectively, a width between the distal edge 101c, 121c, 141c, 161c and the proximal edge 101d, 121d, 141d, 161d, respectively, and a height along the Z-direction depicted in the figures. In embodiments, the outward facing reflection surfaces 101a, 121a, 141a, 161a, may be curved surfaces, e.g., parabolic surfaces.

The Fresnel mirrors 101, 121, 141, 161, and other Fresnel mirrors disclosed herein, may be formed from lens material suitable for forming a reflection surface. Non-limiting examples of suitable Fresnel mirror materials include glass with an outwardly facing reflection surface, acrylic polymers with an outwardly facing reflection surface, polycarbonate polymers with an outwardly facing reflection surface and rigid vinyl polymers with an outwardly facing reflection surface. The outwardly facing reflection surface may be formed from materials that provide a "mirror" surface such as, without limitation, silver, aluminum, photonic crystals, and the like.

Referring back to FIG. 1, the distal edges 101c, 121c, 141c, 161c of the Fresnel mirrors 101, 121, 141, 161, respectively, are positioned along the distal surfaces 104, 124, 144, 164 of the casings 103, 123, 143, 163, respectively. In embodiments, each of the distal surfaces 104, 124, 144, 164 of the casings 103, 123, 143, 163, respectively, define a plane and the distal edges 101c, 121c, 141c, 161c of the Fresnel mirrors 101, 121, 141, 161, respectively, are aligned parallel on the plane. Although FIG. 1 depicts the second ends 108, 148 of the object-side Fresnel mirror assemblies 100, 140, respectively, and the second ends 128, 168 of the image-side Fresnel mirror assemblies 120, 160, respectively, positioned in contact with each other, it should be understood that the second ends 108, 148 and/or second ends 128, 168 may be spaced apart from each other along the X-axis such that an uncloaked region or gap (not shown) is present between the spaced apart second ends 108, 148 and/or spaced apart second ends 128, 168. In such embodiments, an image of the portion of the object O positioned above (+Y direction) the uncloaked region is not provided on the image side 14 of the cloaking device assembly 10.

A planar reflection boundary 110 may be positioned between the first object-side Fresnel mirror assembly 100 and the first image-side Fresnel mirror assembly 120 on the first side (+X direction) of the reference optical axis 16, and a planar reflection boundary 150 may be positioned between the second object-side Fresnel mirror assembly 140 and the second image-side Fresnel mirror assembly 160 on the second side (−X direction) of the reference optical axis 16 opposite the first side. In embodiments, the planar reflection boundary 110 extends from the proximal surface 102 of the object-side Fresnel mirror assembly 100 to the proximal surface 122 of the image-side Fresnel mirror assembly 120 (not shown), and the planar reflection boundary 150 extends from the proximal surface 142 of the object-side Fresnel mirror assembly 140 to the proximal surface 162 of the image-side Fresnel mirror assembly 160 (not shown). In other embodiments, and as schematically depicted in FIG. 1, the planar reflection boundary 110 may not extend from the proximal surface 102 of the object-side Fresnel mirror assembly 100 to the proximal surface 122 of the image-side Fresnel mirror assembly 120, and/or the planar reflection boundary 150 may not extend from the proximal surface 142 of the object-side Fresnel mirror assembly 140 to the proximal surface 162 of the image-side Fresnel mirror assembly 160. In such embodiments, the planar reflection boundary 110 and/or the planar reflection boundary 150 may be positioned on the bisecting axis 15 that bisects and extends between the object-side 12 and the image-side 14. That is, the planar reflection boundary 110 may be spaced apart from the proximal surface 102 of the object-side Fresnel mirror assembly 100 and the proximal surface 122 of the image-side Fresnel mirror assembly 120, and/or the planar reflection boundary 150 may be spaced apart from the proximal surface 142 of the object-side Fresnel mirror assembly 140 and the proximal surface 162 of the image-side Fresnel mirror assembly 160. The planar reflection boundary 110 may include a proximal mirror surface 112 and the planar reflection boundary 150 may include a proximal mirror surface 152. The proximal mirror surfaces 112, 152 may be oriented parallel to the reference optical axis 15 and can be made from omnidirectional photonic crystals or mirrors.

Still referring to FIG. 1, light on the first side (+X direction) of the reference optical axis 16 is directed around the cloaked region CR via the first object-side Fresnel mirror assembly 100, the first planar reflection boundary 110, and the first image-side Fresnel mirror assembly 120. Particularly, and in embodiments where the first object-side Fresnel mirror assembly 100 comprises the casing 103 and the first image-side Fresnel mirror assembly 120 comprises the casing 123, light from an object O (shown as arrow '1' in FIG.

1) on the first side (+X direction) of the reference optical axis 16 is incident on the distal surface 104 of the casing 103. Light propagates from the distal surface 104 to the outward facing reflection surfaces 101a (FIG. 2A) of the Fresnel mirrors 101 (shown as arrow '2' in FIG. 1) where it is reflected and propagates to the proximal surface 102. The planar reflection boundary 110 is positioned relative to the first object-side Fresnel mirror assembly 100 such that light 2 reflected by the outward facing reflection surfaces 101a (FIG. 2A) of the Fresnel mirrors 101 is incident on the proximal mirror surface 112 (shown as arrow '3' in FIG. 1). In embodiments, light 3 is focused by the object-side Fresnel mirrors 101 to a focal line $f_1$ extending in the Z-direction. In such embodiments, the proximal mirror surface 112 may be positioned at the focal line $f_1$. It should be understood that the focal line $f_1$, and other focal lines described herein, are provided by the shape of the object-side Fresnel mirrors described herein. For example, the focal line $f_1$ is due to or provided by the curvature (not labeled) of the outward facing reflection surfaces 101a (FIG. 2A) of the object-side Fresnel mirrors 101. Light 3 is reflected by and diverges from the proximal mirror surface 112 (shown as arrow '4' in FIG. 1). The image-side Fresnel mirror assembly 120 is positioned relative to the planar reflection boundary 110 such that light 4 diverging from the proximal mirror surface 112 is incident on the proximal surface 122 of the first image-side Fresnel mirror assembly 120. Light propagates from the proximal surface 122 to the outward facing reflection surfaces 121a (FIG. 2B) of the Fresnel mirrors 121 (shown as arrow '5' in FIG. 1) where it is reflected and propagates to the distal surface 124. Light 5 exits the first image-side Fresnel mirror assembly 120 (shown as arrow '6' in FIG. 1) generally parallel to light 1 incident on the first object-side Fresnel mirror assembly 100 and forms a portion of an image 'I' on the image-side 14 of the cloaking device assembly 10.

Accordingly, light 1 from the object O on the first side (+X direction) of the reference optical axis 16 propagates to the image-side to form the image I on the first side of the reference optical axis 16 via the optical path: Object—first object-side Fresnel mirrors 101—planar reflection boundary 110—first image-side Fresnel mirrors 121—Image. That is, light 1 from the object O on the first side (+X direction) of the reference optical axis 16 propagates via the optical path: object O—outward facing reflection surfaces 101a of the first object-side Fresnel mirrors 101—proximal mirror surface 112 of the planar reflection boundary 110—outward facing reflection surfaces 121a of the first image-side Fresnel mirrors 121—image I. In embodiments, where the first object-side Fresnel mirror assembly 100 comprises the casing 103 and the first image-side Fresnel mirror assembly 120 comprises the casing 123, light 1 from the object O on the first side (+X direction) of the reference optical axis 16 propagates via the optical path: object O—distal surface 104 of the first object-side Fresnel mirror assembly 100—outward facing reflection surfaces 101a of the first object-side Fresnel mirrors 101—proximal surface 102 of the first object-side Fresnel mirror assembly 100—proximal mirror surface 112 of planar reflection boundary 110—proximal surface 122 of the first image-side Fresnel mirror assembly 120—outward facing reflection surfaces 121a of the first image-side Fresnel mirrors 121—distal surface 124 of the first image-side Fresnel mirror assembly 120—image I.

Light on the second side (−X direction) of the reference optical axis 16 is directed around the cloaked region CR via the second object-side Fresnel mirror assembly 140, the second planar reflection boundary 150, and the second image-side Fresnel mirror assembly 160. Particularly, in embodiments where the second object-side Fresnel mirror assembly 140 comprises the casing 143 and the second image-side Fresnel mirror assembly 160 comprises the casing 163, light from an object O (shown as arrow '1' in FIG. 1) on the second side (−X direction) of the reference optical axis 16 is incident on the distal surface 144 of the casing 143. Light propagates from the distal surface 144 to the outward facing reflection surfaces 141a (FIG. 2C) of the Fresnel mirrors 141 (shown as arrow '2' in FIG. 1) where it is reflected and propagates to the proximal surface 142. The planar reflection boundary 150 is positioned relative to the second object-side Fresnel mirror assembly 140 such that light 2 reflected by the outward facing reflection surfaces 141a of the Fresnel mirrors 141 is incident on the proximal mirror surface 152 (shown as arrow '3' in FIG. 1). In embodiments, light 3 is focused by the object-side Fresnel mirrors 141 to a focal line $f_2$ extending in the Z-direction. In such embodiments, the proximal mirror surface 152 may be positioned at the focal line $f_2$. Light 3 is reflected by and diverges from the proximal mirror surface 152 (shown as arrow '4' in FIG. 1). The image-side Fresnel mirror assembly 160 is positioned relative to the planar reflection boundary 150 such that light 4 diverging from the proximal mirror surface 152 is incident on the proximal surface 162 of the second image-side Fresnel mirror assembly 160. Light propagates from the proximal surface 162 to the outward facing reflection surfaces 161a (FIG. 2D) of the Fresnel mirrors 161 (shown as arrow '5' in FIG. 1) where it is reflected and propagates to the distal surface 164. Light 5 exits the second image-side Fresnel mirror assembly 160 (shown as arrow '6' in FIG. 1) generally parallel to light 1 incident on the second object-side Fresnel mirror assembly 140 and forms a portion of an image 'I' on the second side (−X direction) of the reference optical axis 16 on the image-side 14 of the cloaking device assembly 10.

Accordingly, light 1 from the object O on the second side (−X direction) of the reference optical axis 16 propagates to the image-side to form the image I on the second side of the reference optical axis 16 via the optical path: Object—second object-side Fresnel mirrors 141—second planar reflection boundary 150—second image-side Fresnel mirrors 161—Image. That is, light 1 from the object O on the first side (+X direction) of the reference optical axis 16 propagates via the optical path: object O—outward facing reflection surfaces 141a of the second object-side Fresnel mirrors 141—proximal mirror surface 152 of the second planar reflection boundary 150—outward facing reflection surfaces 161a of the second image-side Fresnel mirrors 161—image I. In embodiments, where the second object-side Fresnel mirror assembly 140 comprises the casing 143 and the second image-side Fresnel mirror assembly 160 comprises the casing 163, light 1 from the object O on the second side (−X direction) of the reference optical axis 16 propagates via the optical path: object O—distal surface 144 of the second object-side Fresnel mirror assembly 140—outward facing reflection surfaces 141a of the second object-side Fresnel mirrors 141—proximal surface 142 of the second object-side Fresnel mirror assembly 140—proximal mirror surface 152 of planar reflection boundary 150—proximal surface 162 of the second image-side Fresnel mirror assembly 160—outward facing reflection surfaces 161a of the second image-side Fresnel mirrors 161—distal surface 164 of the second image-side Fresnel mirror assembly 160—image I.

In combination, i.e., light 1 on the first side (+X direction) and second side (−X direction) of the reference optical axis 16 from the object O on the object-side 12 of the cloaking device assembly 10 propagates to the image-side 14 via the optical path: Object—object-side Fresnel mirrors 101, 141—planar reflection boundaries 110, 150—image-side Fresnel mirrors 121, 161—Image. That is, light 1 from the object O propagates via the optical path: object O—outward facing reflection surfaces 101a, 141a of the object-side Fresnel mirrors 101, 141, respectively—proximal mirror surfaces 112, 152 of the planar reflection boundaries 110, 150, respectively—outward facing reflection surfaces 121a, 161a of the image-side Fresnel mirrors 121, 161, respectively—image I. In embodiments, where the Fresnel mirror assemblies 100, 120, 140, 160 comprise the casings 103, 123, 143, 163, respectively, light 1 from the object O on the first side (+X direction) and the second side (−X direction) of the reference optical axis 16 propagates via the optical path: object O—distal surfaces 104, 144 of the first and second object-side Fresnel mirror assemblies 100, 140, respectively—outward facing reflection surfaces 101a, 141a of the first and second object-side Fresnel mirrors 101, 141, respectively—proximal surfaces 102, 142 of the first and second object-side Fresnel mirror assemblies 100, 140, respectively—proximal mirror surfaces 112, 152 of the planar reflection boundaries 110, 150, respectively—proximal surfaces 122, 162 of the first and second image-side Fresnel mirror assemblies 120, 160, respectively—outward facing reflection surfaces 121a, 161a of the first and second image-side Fresnel mirrors 121, 161, respectively—distal surfaces 124, 164 of the first and second image-side Fresnel mirror assemblies 120, 160—image I.

Figure 3:
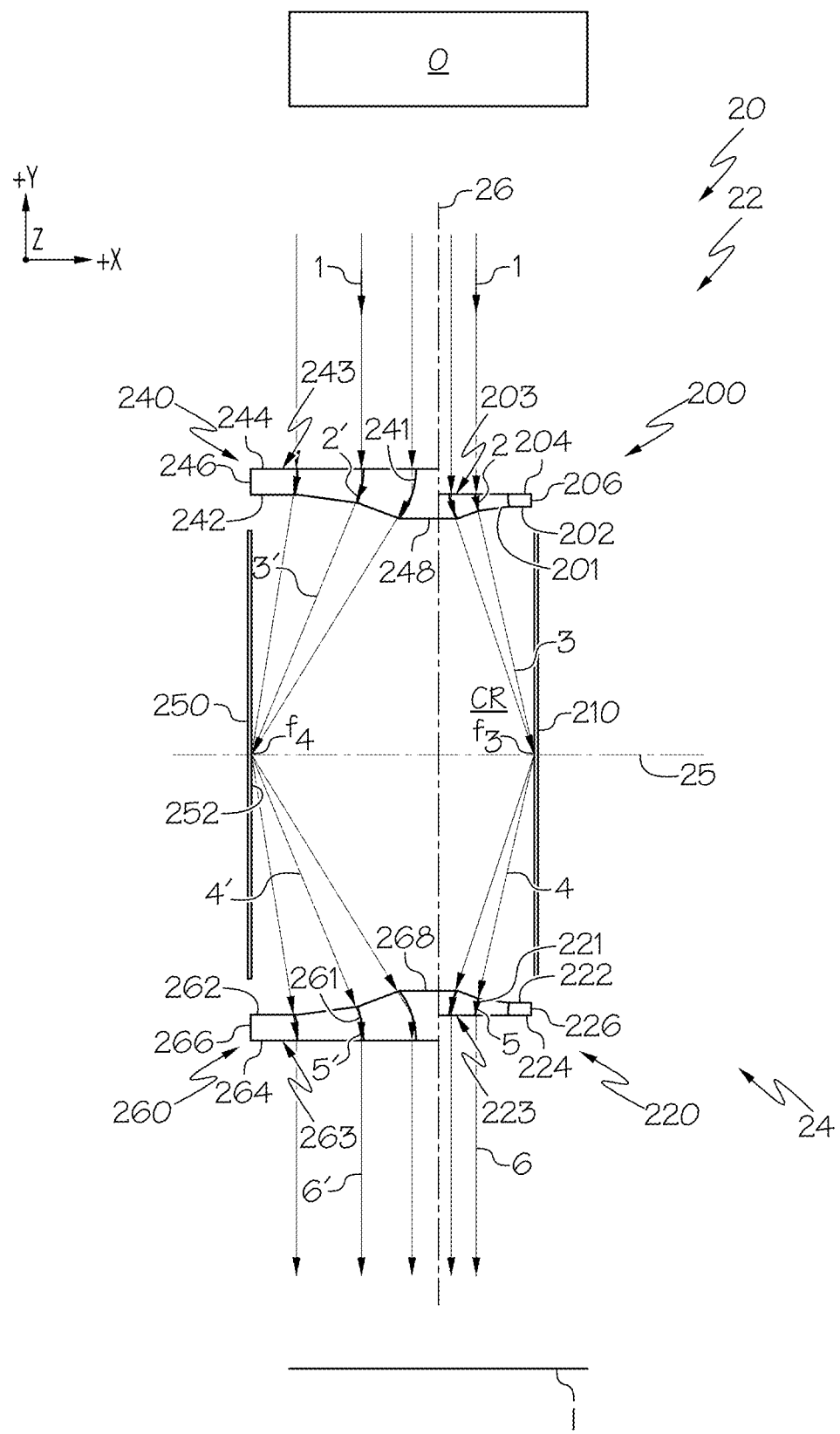
FIG. 3 schematically depicts a top view of a cloaking device according to one or more embodiments disclosed and described herein.

Although FIG. 1 depicts the four Fresnel mirror assemblies 100, 120, 140, 160 being of the same size, i.e., the lengths of the proximal surfaces 102, 122, 142, 162 are equal and the thicknesses of the first ends 106, 126, 146, 166 are equal, in some embodiments, the four Fresnel mirror assemblies 100, 120, 140, 160 are not the same size. Particularly, FIG. 3 depicts a cloaking device assembly 20 with half Fresnel lenses of different sizes. The cloaking device assembly 20 includes an object-side 22, an image-side 24, and four Fresnel mirror assemblies 200, 220, 240, 260. The object-side 22 is positioned above (+Y direction) a bisecting axis 25 and the image-side 24 is positioned below (−Y direction) the bisecting axis 25. That is, the bisecting axis 25 extends between and delineates the object-side 22 and the image-side 24. The two Fresnel mirror assemblies 200, 220 on the first side (+X direction) of a reference optical axis 26 are smaller than the two Fresnel mirror assemblies 240, 260 on the second side (−X direction) of the reference optical axis 26 as discussed in greater detail below. A cloaked region CR is positioned between the Fresnel mirror assemblies 200, 240 and the Fresnel mirror assemblies 220, 260. Each of the four Fresnel mirror assemblies 200, 220, 240, 260 have a length along the X-axis, a thickness along the Y-axis and a height along the Z-axis shown in the figures. The two Fresnel mirror assemblies 200, 240 may be positioned on the object-side 22 of the cloaking device assembly 20 to face an object 'O' and may be referred to herein as object-side Fresnel mirror assemblies 200, 240. The two Fresnel mirror assemblies 220, 260 may be positioned on the image-side 24 of the cloaking device assembly 20 to provide an image 'I' formed by the cloaking device assembly 20 and may be referred to herein as image-side Fresnel mirror assemblies 220, 260.

Each of the four Fresnel mirror assemblies 200, 220, 240, 260 may comprise a plurality of Fresnel mirrors 201, 221, 241, 261, and the Fresnel mirrors 201, 221, 241, 261 may be disposed within a transparent casing, a frame, and the like. That is, in some embodiments, the Fresnel mirrors 201, 221, 241, 261 may be encapsulated within a casing 203, 223, 243, 263, respectively, formed from a transparent glass, a transparent polymer, etc. In other embodiments, the Fresnel mirrors 201, 221, 241, 261 may be positioned and held within a frame (now shown) without being encapsulated within a transparent casing. In still other embodiments, the Fresnel mirrors 201, 221, 241, 261 may be encapsulated within the casing 203, 223, 243, 263, respectively, and positioned and held within a frame (not shown). The Fresnel mirror assemblies 200, 220, 240, 260 each have a proximal surface 202, 222, 242, 262 and a distal surface 204, 224, 244, 264, respectively. Also, the Fresnel mirror assemblies 200, 220, 240, 260 each have a first end 206, 226, 246, 266 and a second end 208, 228, 248, 268, respectively. The proximal surfaces 202, 222, 242, 262 and the distal surfaces 204, 224, 244, 264 extend between the first ends 206, 226, 246 266 and the second ends 208, 228, 248, 268, respectively.

As depicted in FIG. 3, the proximal surface 202 of the object-side Fresnel mirror assembly 200 may have a length (X-direction) that is less than a length of the proximal surface 242 of the object-side Fresnel mirror assembly 240 and the proximal surface 222 of the image-side Fresnel mirror assembly 220 may have a length that is less than a length of the proximal surface 262 of the image-side Fresnel mirror assembly 260. In the alternative, or in addition to, the first end 206 of the object-side Fresnel mirror assembly 200 may have a thickness (Y direction) that is less than a thickness of the first end 246 of the object-side Fresnel mirror assembly 240 and the first end 226 of the image-side Fresnel mirror assembly 220 may have a thickness that is less than a thickness of the first end 266 of the image-side Fresnel mirror assembly 260.

In embodiments, the second ends 208, 228, 248, 268 are positioned proximal or adjacent to the reference optical axis 26 extending from the object-side 22 to the image-side 24. In such embodiments, the first ends 206, 226, 246, 266 are positioned distal to or spaced apart from the reference optical axis 26. Although FIG. 3 depicts the second ends 208, 248 of the object-side Fresnel mirror assemblies 200, 240, respectively, and the second ends 228, 268 of the image-side Fresnel mirror assemblies 220, 260, respectively, positioned in contact with each other, it should be understood that the second ends 208, 248 and/or second ends 228, 268 may be spaced apart from each other along the X-axis such that an uncloaked region or gap (not shown) is present between the spaced apart second ends 208, 248 and/or spaced apart second ends 228, 268. In such embodiments, an image of the portion of the object O positioned above (+Y direction) the uncloaked region is not provided on the image side 24 of the cloaking device assembly 20.

A planar reflection boundary 210 may be positioned between the object-side Fresnel mirror assembly 200 and the image-side Fresnel mirror assembly 220 on a first side (+X direction) of the reference optical axis 26 and a planar reflection boundary 250 may be positioned between the object-side Fresnel mirror assembly 240 and the image-side Fresnel mirror assembly 260 on a second side (−X direction) of the reference optical axis 26 opposite the first side. In embodiments, the planar reflection boundary 210 extends from the proximal surface 202 of the object-side Fresnel mirror assembly 200 to the proximal surface 222 of the image-side Fresnel mirror assembly 220 (not shown), and the planar reflection boundary 250 extends from the proximal surface 242 of the object-side Fresnel mirror assembly 240 to the proximal surface 262 of the image-side Fresnel mirror assembly 260 (not shown). In other embodiments, the planar reflection boundary 210 may not extend from the proximal surface 202 of the object-side Fresnel mirror assembly 200 to the proximal surface 222 of the image-side Fresnel mirror assembly 220, and the planar reflection boundary 250 may not extend from the proximal surface 242 of the object-side Fresnel mirror assembly 240 to the proximal surface 262 of the image-side Fresnel mirror assembly 260 as depicted in FIG. 3. In such embodiments, the planar reflection boundary 210 and/or the planar reflection boundary 250 may be positioned on a bisecting axis 25 that bisects and extends between the object-side 22 and the image-side 24. That is, the planar reflection boundary 210 may be spaced apart from the proximal surface 202 of the object-side Fresnel mirror assembly 200 and/or the proximal surface 222 of the image-side Fresnel mirror assembly 220, and/or the planar reflection boundary 250 may be spaced apart from the proximal surface 242 of the object-side Fresnel mirror assembly 240 and/or the proximal surface 262 of the image-side Fresnel mirror assembly 260. The planar reflection boundary 210 may include a proximal mirror surface 212 and the planar reflection boundary 250 may include a proximal mirror surface 252. The proximal mirror surfaces 212, 252 may be oriented parallel to the reference optical axis 26 and can be made from omnidirectional photonic crystals or mirrors.

Still referring to FIG. 3, light on the first side (+X direction) of the reference optical axis 26 is directed around the cloaked region CR via the first object-side Fresnel mirror assembly 200, the first planar reflection boundary 210, and the first image-side Fresnel mirror assembly 220. Particularly, light from an object O (shown as arrow '1' in FIG. 1) on the first side (+X direction) of the reference optical axis 26 is incident on the distal surface 204 of the casing 203. Particularly, and in embodiments where the first object-side Fresnel mirror assembly 200 comprises the casing 203 and the first image-side Fresnel mirror assembly 220 comprises the casing 223, light 1 from the object O on the first side (+X direction) of the reference optical axis 26 is incident on the distal surface 204 of the casing 203. Light 2 propagates from the distal surface 204 to the Fresnel mirrors 201 where it is reflected and propagates to the proximal surface 202. The planar reflection boundary 210 is positioned relative to the first object-side Fresnel mirror assembly 200 such that light 2 reflected by the Fresnel mirrors 201 is incident on the proximal mirror surface 212 as light 3. In embodiments, light 3 is focused by the object-side Fresnel mirrors 201 to a focal line $f_3$ extending in the Z-direction. In such embodiments, the proximal mirror surface 212 may be positioned at the focal line $f_3$. Light 3 is reflected by and diverges from the proximal mirror surface 212 as light 4. The image-side Fresnel mirror assembly 220 is positioned relative to the planar reflection boundary 210 such that light 4 diverging from the proximal mirror surface 212 is incident on the proximal surface 222 of the first image-side Fresnel mirror assembly 220. Light propagates from the proximal surface 222 to the Fresnel mirrors 221 as light 5 where it is reflected and propagates to the distal surface 224. Light 5 is reflected and exits the first image-side Fresnel mirror assembly 220 as light 6 generally parallel to light 1 incident on the first object-side Fresnel mirror assembly 200 and forms a portion of an image 'I' on the image-side 24 of the cloaking device assembly 20.

Accordingly, light 1 from the object O on the first side (+X direction) of the reference optical axis 26 propagates to the image-side to form the image I on the first side of the reference optical axis 26 via the optical path: Object—first object-side Fresnel mirror assembly 200—first planar reflection boundary 210—first image-side Fresnel mirror assembly 220—Image. That is, light 1 from the object O on the first side (+X direction) of the reference optical axis 26 propagates via the optical path: object O—first object-side Fresnel mirrors 201—proximal mirror surface 212 of the first planar reflection boundary 210—first image-side Fresnel mirrors 21—image I. In embodiments, where the first object-side Fresnel mirror assembly 200 comprises the casing 203 and the first image-side Fresnel mirror assembly 220 comprises the casing 223, light 1 from the object O on the first side (+X direction) of the reference optical axis 26 propagates via the optical path: object O—distal surface 204 of the first object-side Fresnel mirror assembly 200—first object-side Fresnel mirrors 201—proximal surface 202 of the first object-side Fresnel mirror assembly 200—proximal mirror surface 212 of planar reflection boundary 210—proximal surface 222 of the first image-side Fresnel mirror assembly 220—first image-side Fresnel mirrors 221—distal surface 224 of the first image-side Fresnel mirror assembly 220—image I.

Light on the second side (−X direction) of the reference optical axis 26 is directed around the cloaked region CR via the second object-side Fresnel mirror assembly 240, the second planar reflection boundary 250, and the second image-side Fresnel mirror assembly 260. Particularly, and in embodiments where the second object-side Fresnel mirror assembly 240 comprises the casing 243 and the second image-side Fresnel mirror assembly 260 comprises the casing 263, light from an object O (shown as arrow '1' in FIG. 3) on the second side (−X direction) of the reference optical axis 26 is incident on the distal surface 244 of the casing 243. Light propagates from the distal surface 244 to the Fresnel mirrors 241 (shown as arrow '2'') where it is reflected and propagates to the proximal surface 242. The planar reflection boundary 250 is positioned relative to the second object-side Fresnel mirror assembly 240 such that light 2' reflected by the Fresnel mirrors 241 is incident on the proximal mirror surface 252 (shown as arrow '3''). In embodiments, light 3' is focused by the object-side Fresnel mirrors 241 to a focal line $f_4$ extending in the Z-direction. In such embodiments, the proximal mirror surface 252 may be positioned at the focal line $f_4$. Light 3' is reflected by and diverges from the proximal mirror surface 252 (shown as arrow '4''). The image-side Fresnel mirror assembly 260 is positioned relative to the planar reflection boundary 250 such that light 3' reflected by and diverging from the proximal mirror surface 252 is incident on the proximal surface 262 of the second image-side Fresnel mirror assembly 260. Light propagates from the proximal surface 262 to the Fresnel mirrors 261 (shown as arrow '5'') where it is reflected and propagates to the distal surface 264. Light 5' exits the second image-side Fresnel mirror assembly 260 (shown as arrow '6') generally parallel to light 1 incident on the second object-side Fresnel mirror assembly 240 and forms a portion of an image 'I' on the second side (−X direction) of the reference optical axis 26 on the image-side 24 of the cloaking device assembly 20.

Accordingly, light 1 from the object O on the second side (−X direction) of the reference optical axis 26 propagates to the image-side to form the image I on the second side of the reference optical axis 26 via the optical path: Object—second object-side Fresnel mirror assembly 240—second planar reflection boundary 250—second image-side Fresnel mirror assembly 260—Image. That is, light 1 from the object O on the second side (−X direction) of the reference optical axis 26 propagates via the optical path: object O—second object-side Fresnel mirrors 241—proximal mirror surface 252 of the second planar reflection boundary 250—second image-side Fresnel mirrors 261—image I. In embodiments, where the second object-side Fresnel mirror assembly 240 comprises the casing 243 and the second image-side Fresnel mirror assembly 260 comprises the casing 263, light 1 from the object O on the second side (−X direction) of the reference optical axis 26 propagates via the optical path: object O—distal surface 244 of the second object-side Fresnel mirror assembly 240—second object-side Fresnel mirrors 241—proximal surface 242 of the second object-side Fresnel mirror assembly 240 —proximal mirror surface 252 of planar reflection boundary 250—proximal surface 262 of the second image-side Fresnel mirror assembly 260—second image-side Fresnel mirrors 261—distal surface 264 of the second image-side Fresnel mirror assembly 260—image I.

In combination, i.e., light 1 on the first side (+X direction) and second side (−X direction) of the reference optical axis 26 from the object O on the object-side 22 of the cloaking device assembly 20 propagates to the image-side 24 via the optical path: Object—object-side Fresnel mirror assemblies 200, 240—planar reflection boundaries 210, 250—image-side Fresnel mirror assemblies 220, 260—Image. That is, light 1 from the object O propagates via the optical path: object O—object-side Fresnel mirrors 201, 241—proximal mirror surfaces 212, 252 of the planar reflection boundaries 210, 250, respectively—image-side Fresnel mirrors 221, 261 —image I. In embodiments, where the Fresnel mirror assemblies 200, 220, 240, 260 comprise the casings 203, 223, 243, 263, respectively, light 1 from the object O on the first side (+X direction) and the second side (−X direction) of the reference optical axis 26 propagates via the optical path: object O—distal surfaces 204, 244 of the first and second object-side Fresnel mirror assemblies 200, 240, respectively—first and second object-side Fresnel mirrors 201, 241—proximal surfaces 202, 242 of the first and second object-side Fresnel mirror assemblies 200, 240, respectively—proximal mirror surfaces 212, 252 of the planar reflection boundaries 210, 250, respectively—proximal surfaces 222, 262 of the first and second image-side Fresnel mirror assemblies 220, 260, respectively—first and second image-side Fresnel mirrors 221, 261, respectively—distal surfaces 224, 264 of the first and second image-side Fresnel mirror assemblies 220, 260—image I.

Figure 4:
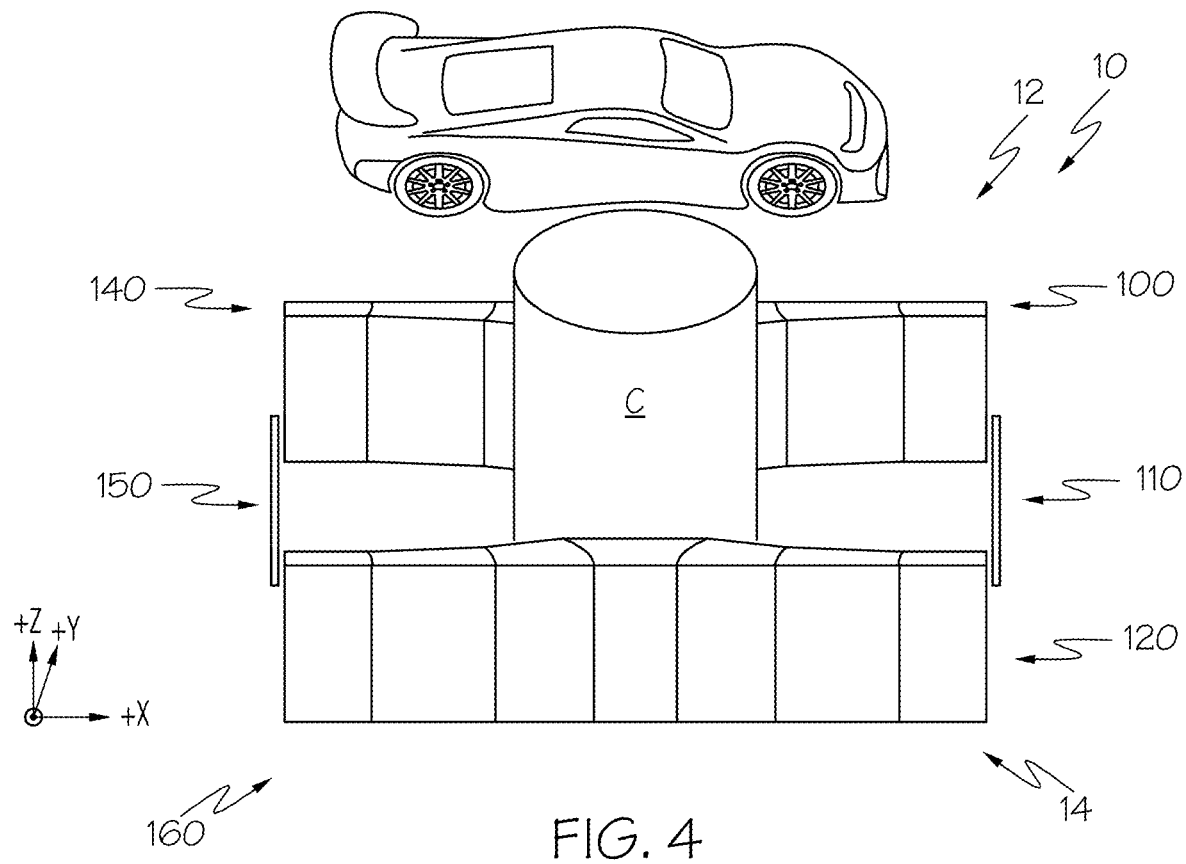
FIG. 4 schematically depicts a top perspective view of the cloaking device of FIG. 1 with a first object on one side of the cloaking device and a second object within the cloaked region of the cloaking device according to one or more embodiments disclosed and described herein.
Figure 5:
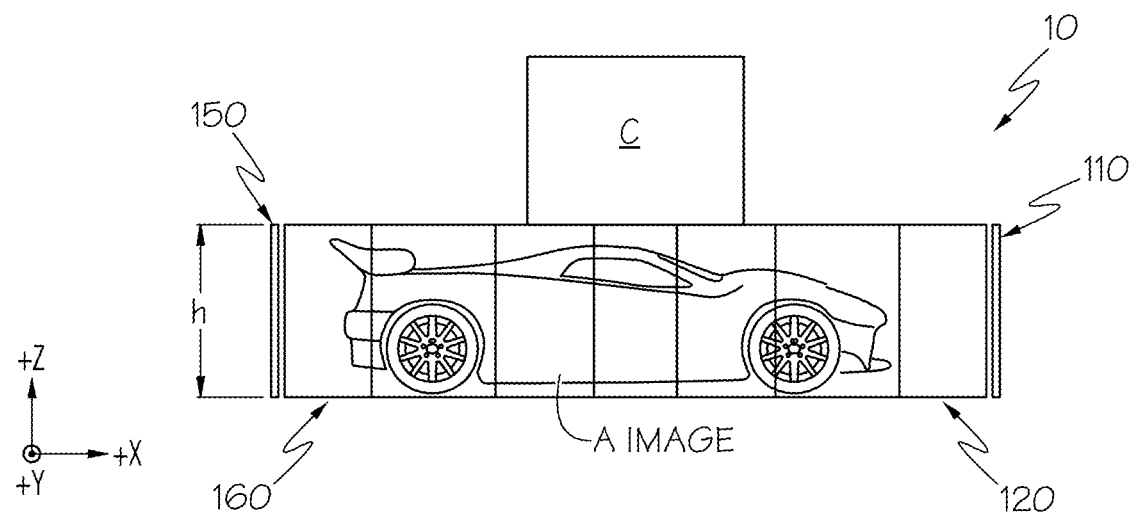
FIG. 5 schematically depicts a side view of the cloaking device of FIG. 1 with the first object on one side of the cloaking device and the second object within the cloaked region of the cloaking device.

Referring now to FIGS. 1, 4 and 5, a top perspective view and a side view of a cloaking device according to embodiments as discussed with respect to FIG. 1 are shown in FIGS. 4 and 5, respectively. Specifically, FIG. 4 is a top perspective view of an article in the form of a column 'C' within the cloaked region CR of the cloaking device assembly 10 and an automobile 'A' located behind the column C on the object-side 12 of the cloaking device assembly 10 in the +Y direction. The column C has a height dimension in the Z direction (increasing height in the +Z direction) greater than the height h of the cloaking device (FIG. 5). FIG. 5 is a side view from the +Y direction of the cloaking device assembly 10 shown in FIG. 1 and shows the portion of the column C that is within the cloaked region is not visible and the automobile A located behind the column C in the +Y direction is visible to an observer viewing the cloaking device assembly 10 in the +Y direction. Accordingly, the column C positioned within the cloaked region is not visible to an observer viewing the image-side 14 of the cloaking device assembly 10 and an image of the automobile A is visible to the observer viewing the image-side 14. Although column C in FIGS. 4 and 5 is separate from the proximal surfaces (e.g., proximal surfaces 102, 122, 142, 162 of cloaking device assembly 10), i.e., column C is a separate object from the cloaking device assembly 10, it should be appreciated that column C may be structurally part of cloaking device assembly 10 and have an outer surface that provides or is equivalent to the proximal surfaces of the Fresnel mirror assemblies 100, 120, 140, 160.

Figure 6:
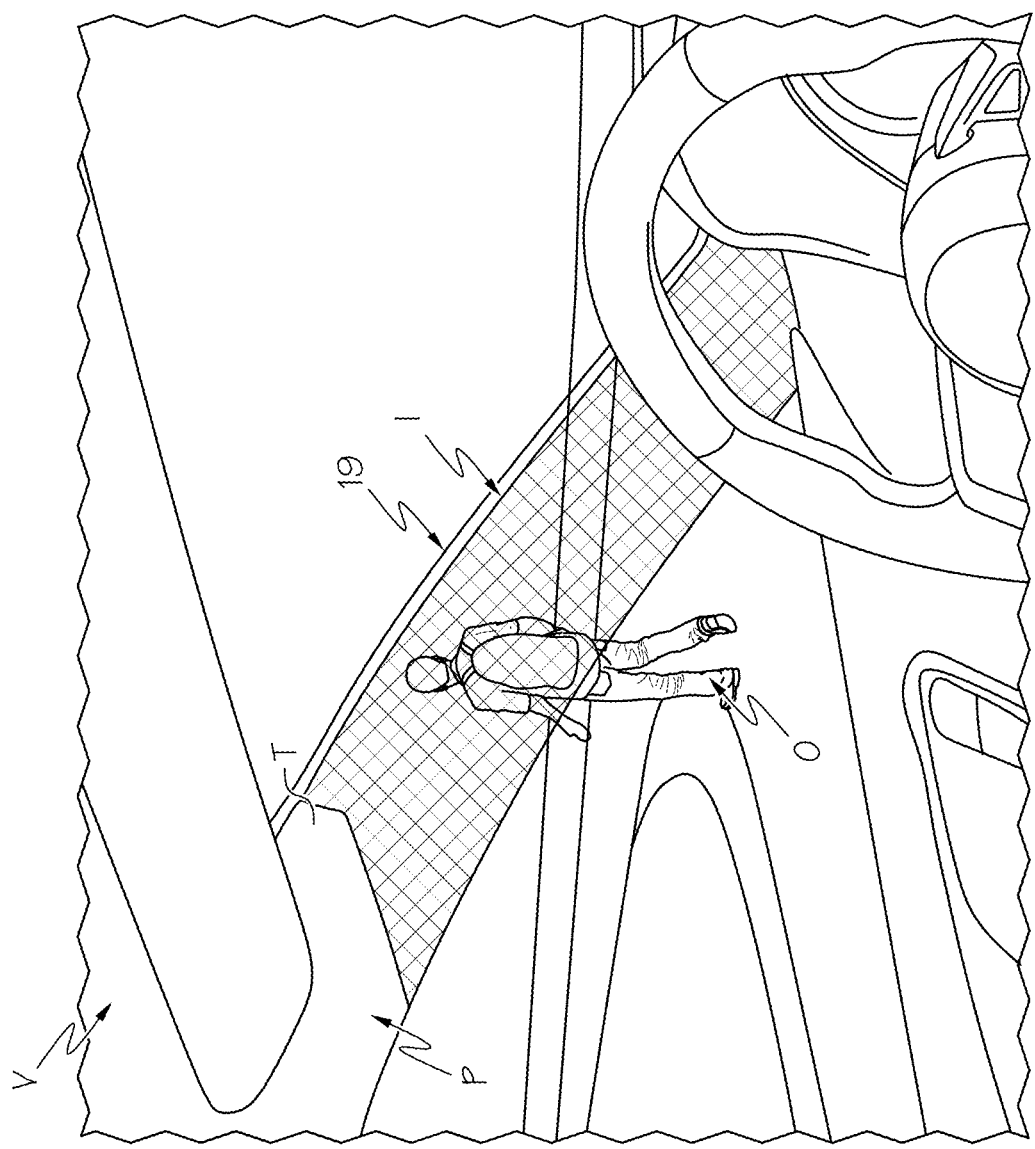
FIG. 6 schematically depicts a cloaking device cloaking a vehicle A-pillar of a vehicle according to one or more embodiments described and illustrated herein.

Referring to FIG. 6, embodiments of an A-pillar of a vehicle being cloaked by a cloaking device are shown. Particularly, FIG. 6 shows a cloaking device 19 as described herein cloaking a portion of an A-pillar P of a vehicle V. A portion of the A-pillar P is positioned within a cloaked region (not shown) of the cloaking device 19 and a portion of the A-pillar P extends beyond the cloaking device and is covered with trim T. Illustrated outside of the vehicle V on the object-side of the cloaking device 19 is a target object 'O' in the form of pedestrian. A portion of the pedestrian O is visible through a side window of the vehicle V and a portion of the pedestrian is visible "through" the A-pillar P cloaked by the cloaking device 19. The cloaking device 19 redirects light reflected from the pedestrian O around the A-pillar P positioned within the cloaked region of the cloaking device 19 and forms an image I of the pedestrian O in the interior of the vehicle on the image-side of the cloaking device 19 that is visible to an occupant of the vehicle V looking towards the pedestrian O. Accordingly, light from the pedestrian O appears to pass through the A-pillar P and a blind spot typically created by the A-pillar P is not as present as when the portion of the A-pillar P is not positioned within the cloaked region of the cloaking device 19. In embodiments, the A-pillar P itself serves as the cloaked region, i.e. the A-pillar P has an outer surface with one or more inward facing surfaces that assist in redirecting light from the pedestrian) around the A-pillar P. It should be appreciated that cloaking of the A-pillar P with the cloaking device 19 and bypassing the blind spot produced by the A-pillar P is performed without the use of metamaterials, video images, cameras, sophisticated electronics, etc.

EXAMPLES

Figure 7A:
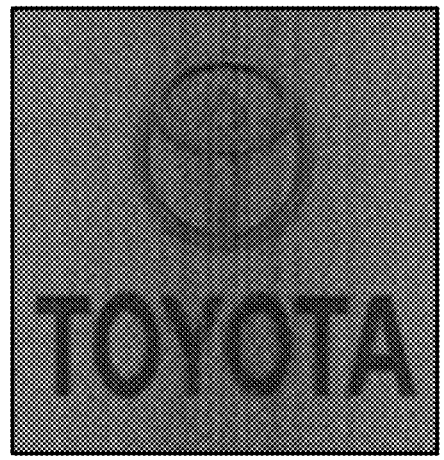
FIG. 7A depicts a computer simulated cloaking image for a cloaking device assembly utilizing Fresnel lenses.
Figure 7B:
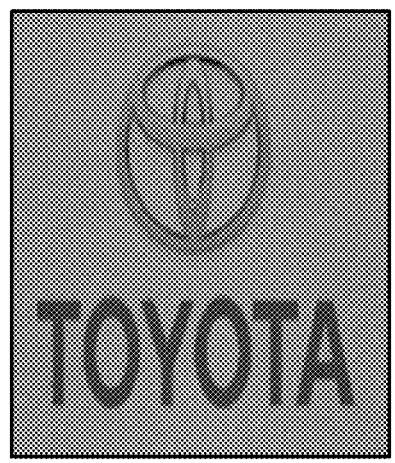
FIG. 7B depicts a computer simulated cloaking image for a cloaking device assembly according to the embodiments of FIG. 1 utilizing Fresnel mirrors.

Referring now to FIGS. 7A-7B, an image of an object in the form of an emblem positioned on the object-side of a cloaking device assembly utilizing Fresnel lenses is depicted in FIG. 7A and an image of the same object positioned on the object-side of a cloaking device assembly utilizing Fresnel mirrors is depicted in FIG. 7B. The images were simulated using a commercial software program (Zemax OpticStudio). The cloaking device assembly simulated to provide the image depicted in FIG. 7A comprised four half Fresnel cylindrical lenses and two planar reflection boundaries as disclosed and described in U.S. patent application Ser. No. 15/863,353 filed on Jan. 5, 2018. The cloaking device assembly 10 simulated to provide the image depicted in FIG. 7B comprised four Fresnel mirror assemblies 100, 120, 140, 160 with ten Fresnel mirrors 101, ten Fresnel mirrors 121, ten Fresnel mirrors 141, and ten Fresnel mirrors 161, respectively. The cloaking ratio (i.e., hidden area/total device area) of the cloaking device assembly simulated to provide the image depicted in FIG. 7A was about 48% and the cloaking ratio of the cloaking device assembly 10 simulated to provide the image depicted in FIG. 7B was about 40%. It should be understood that the cloaking ratio of the cloaking device assembly 10 can be increased by increasing the number of Fresnel mirrors within the Fresnel mirror assemblies 100, 120, 140, 160. As shown by the images in FIGS. 7A-7B, an image of an object on the object-side 12 of the cloaking device assembly 10 utilizing Fresnel mirrors has less aberration effects that the cloaking device assembly utilizing Fresnel lenses.

The cloaking devices described herein may be used to cloak vehicle articles when viewed from within the vehicle, such as a vehicle A-pillar, B-pillar, C-pillar, D-pillar, etc., and bypass a blind spot caused by the vehicle article. The terms "object" and "article," may interchangeably refer to a visual object or image (2D or 3D) that reflects light or transmits light and the term "light from" may refer to "light reflected from" or "light transmitted from." The terms "generally" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

Although the embodiments disclosed and described in the figures depict a cloaking device assembly with a cloaked region bounded by four Fresnel mirror assemblies and two planar reflection boundaries, cloaking assemblies with a cloaked region bounded by two Fresnel mirror assemblies and one planar reflection boundary are provided. For example and without limitation, a cloaked region may be bounded between an object-side Fresnel mirror assembly, a planar reflection boundary and an image-side Fresnel mirror assembly.

Directional terms as used herein—for example up, down, right, left, front, back, top, bottom, vertical, horizontal—are made only with reference to the figures as drawn and are not intended to imply absolute orientation unless otherwise expressly stated.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A cloaking device comprising:
    an object-side, an image-side, a cloaked region between the object-side and the image-side, and a reference optical axis extending from the object-side to the image-side;
    a plurality of object-side Fresnel mirrors positioned on the object-side and a plurality of image-side Fresnel mirrors positioned on the image-side, each of the plurality of object-side Fresnel mirrors and each of the plurality of image-side Fresnel mirrors comprising an outward facing curved reflection surface; and
    a planar reflection boundary positioned between the plurality of object-side Fresnel mirrors and the plurality of image-side Fresnel mirrors, the planar reflection boundary comprising an inward facing mirror surface oriented parallel with the reference optical axis;
    wherein light from an object positioned on the object-side of the cloaking device and obscured by the cloaked region is redirected around the cloaked region by the plurality of object-side Fresnel mirrors, the planar reflection boundary and the plurality of image-side Fresnel mirrors to form an image of the object on the image-side of the cloaking device such that the light from the object appears to pass through the cloaked region.

2. The cloaking device of claim 1, wherein the inward facing mirror surface of the planar reflection boundary is positioned at a focal line of the plurality of object-side Fresnel mirrors.

3. The cloaking device of claim 1, wherein the outward facing curved reflection surface for each of the plurality of object-side Fresnel mirrors and each of the plurality of image-side Fresnel mirrors is an outward facing parabolic reflection surface.

4. The cloaking device of claim 1, wherein the plurality of object-side Fresnel mirrors are disposed within an object-side transparent casing and the plurality of image-side Fresnel mirrors are disposed within an image-side transparent casing.

5. The cloaking device of claim 1, wherein:
    the plurality of object-side Fresnel mirrors are oriented to focus light from the object positioned on the object-side of the cloaking device onto the inward facing mirror surface of the planar reflection boundary;
    the inward facing mirror surface of the planar reflection boundary is oriented to reflect light from the plurality of object-side Fresnel mirrors to the plurality of image-side Fresnel mirrors;
    light reflected from the inward facing mirror surface of the planar reflection boundary is diverging light; and
    the plurality of image-side Fresnel mirrors are oriented to focus the diverging light from the inward facing mirror surface of the planar reflection boundary to form the image of the object on the image-side of the cloaking device.

6. The cloaking device of claim 1, wherein light from the object on the object-side of the cloaking device is redirected around the cloaked region via an optical path: object—outward facing curved surfaces of the plurality of object-side Fresnel mirrors—inward facing mirror surface of the planar reflection boundary—outward facing curved surfaces of the plurality of image-side Fresnel mirrors—image.

7. The cloaking device of claim 1, wherein:
    the plurality of object-side Fresnel mirrors comprise a first set of object-side Fresnel mirrors positioned on a first side of the reference optical axis and a second set of object-side Fresnel mirrors positioned on a second side of the reference optical axis opposite the first side;
    the plurality of image-side Fresnel mirrors comprise a first set of image-side Fresnel mirrors on the first side of the reference optical axis and a second set of image-side Fresnel mirrors positioned on the second side of the reference optical axis;
    the planar reflection boundary comprises a pair of planar reflection boundaries with a first planar reflection boundary positioned between the first set of object-side Fresnel mirrors and the first set of image-side Fresnel mirrors positioned on the first side of the reference optical axis and a second planar reflection boundary positioned between the second set of object-side Fresnel mirrors and the second set of image-side Fresnel mirrors positioned on the second side of the reference optical axis; and
    light from the object positioned on the object-side of the cloaking device and obscured by the cloaked region is redirected around the cloaked region by the first and second set of object-side Fresnel mirrors, the first and second planar reflection boundaries, and the first and second set of image-side Fresnel mirrors to form the image of the object on the image-side of the cloaking device such that the light from the object appears to pass through the cloaked region.

8. The cloaking device of claim 7, wherein:
the first set of object-side Fresnel mirrors are disposed within a first object-side transparent casing and the second set of object-side Fresnel mirrors are disposed within a second object-side transparent casing; and
the first set of image-side Fresnel mirrors are disposed within a first image-side transparent casing and the second set of image-side Fresnel mirrors are disposed within a second image-side transparent casing.

9. A cloaking device assembly comprising:
an object-side, an image-side, a cloaked region, a cloaked article positioned within the cloaked region, and a reference optical axis extending from the object-side to the image-side;
a plurality of object-side Fresnel mirrors positioned on the object-side and comprising a first set of object-side Fresnel mirrors positioned on a first side of the reference optical axis and a second set of object-side Fresnel mirrors positioned on a second side of the reference optical axis opposite the first side, wherein each of the plurality of object-side Fresnel mirrors comprise an outward facing curved reflection surface;
a plurality of image-side Fresnel mirrors positioned on the image-side and comprising a first set of image-side Fresnel mirrors positioned on the first side of the reference optical axis and a second set of image-side Fresnel mirrors positioned on the second side of the reference optical axis opposite the first side, wherein each of the plurality of image-side Fresnel mirrors comprise an outward facing curved reflection surface; and
a pair of planar reflection boundaries comprising a first planar reflection boundary positioned between the first set of object-side Fresnel mirrors and the first set of image-side Fresnel mirrors positioned on the first side of the reference optical axis and a second planar reflection boundary positioned between the second set of object-side Fresnel mirrors and the second set of image-side Fresnel mirrors positioned on the second side of the reference optical axis, wherein each of the pair of planar reflection boundaries comprise an inward facing mirror surface oriented parallel to the reference optical axis;
wherein light from an object positioned on the object-side of the cloaking device assembly and obscured by the cloaked region is redirected around the cloaked article by the plurality of object-side Fresnel mirrors, the pair of planar reflection boundaries, and the plurality of image-side Fresnel mirrors to form an image of the object on the image-side of the cloaking device assembly such that the light from the object appears to pass through the cloaked article.

10. The cloaking device assembly of claim 9, wherein the inward facing mirror surface of the first planar reflection boundary is positioned at a focal line of the first set of object-side Fresnel mirrors and the inward facing mirror surface of the second planar reflection boundary is positioned at a focal line of the second set of object-side Fresnel mirrors.

11. The cloaking device assembly of claim 9, wherein the outward facing curved reflection surface for each of the plurality of object-side Fresnel mirrors and each of the plurality of image-side Fresnel mirrors is an outward facing parabolic reflection surface.

12. The cloaking device assembly of claim 9, wherein:
the first set of object-side Fresnel mirrors are disposed within a first object-side transparent casing and the second set of object-side Fresnel mirrors are disposed within a second object-side transparent casing; and
the first set of image-side Fresnel mirrors are disposed within a first image-side transparent casing and the second set of image-side Fresnel mirrors are disposed within a second image-side transparent casing.

13. The cloaking device assembly of claim 9, wherein;
the first set of object-side Fresnel mirrors and the second set of object-side Fresnel mirrors are disposed within an object-side transparent casing; and
the first set of image-side Fresnel mirrors and the second set of image-side Fresnel mirrors are disposed within an image-side transparent casing.

14. The cloaking device assembly of claim 9, wherein light from the object positioned on the object-side of the cloaking device assembly propagates to the image-side to form the image via an optical path: object—plurality of object-side Fresnel mirrors—inward facing mirror surfaces of the pair of planar reflection boundaries—plurality of image-side Fresnel mirrors—image.

15. The cloaking device assembly of claim 9, wherein light from the object positioned on the object-side of the cloaking device assembly propagates to the image-side to form the image via an optical path: object—outward facing curved reflection surfaces of the plurality of object-side Fresnel mirrors—inward facing mirror surfaces of the pair of planar reflection boundaries—outward facing curved reflection surfaces of the plurality of image-side Fresnel mirrors—image.

16. A vehicle comprising:
an A-pillar; and
a cloaking device positioned on the A-pillar, the cloaking device comprising:
an object-side, an image-side, a cloaked region and a reference optical axis extending from the object-side to the image-side, wherein the A-pillar is positioned within the cloaked region, the object-side is positioned on an exterior of the vehicle and the image-side is positioned within an interior of the vehicle;
a plurality of object-side Fresnel mirrors positioned on the object-side and a plurality of image-side Fresnel mirrors positioned on the image-side, wherein each of the plurality of object-side Fresnel mirrors and each of the plurality of image-side Fresnel mirrors comprise an outward facing curved reflection surface; and
a planar reflection boundary positioned between the plurality of object-side Fresnel mirrors and the plurality of image-side Fresnel mirrors, the planar reflection boundary comprising an inward facing mirror surface oriented parallel with the reference optical axis;
wherein light from an object positioned on the object-side of the cloaking device and obscured by the cloaked region is redirected around the A-pillar via reflection of the light by the plurality of object-side Fresnel mirrors onto the planar reflection boundary, reflection of the light by the planar reflection boundary onto the plurality of image-side Fresnel mirrors, and reflection of the light by the plurality of image-side Fresnel mirrors to form an image of the object on the image-side of the cloaking device such that the light from the object appears to pass through the cloaked region.

17. The vehicle of claim 16, wherein the inward facing mirror surface of the planar reflection boundary is positioned at a focal line of the plurality of object-side Fresnel mirrors.

18. The vehicle of claim 16, wherein the plurality of object-side Fresnel mirrors are disposed within an object-side transparent casing and the plurality of image-side Fresnel mirrors are disposed within an image-side transparent casing.

19. The vehicle of claim 16, wherein the outward facing curved reflection surface for each of the plurality of object-side Fresnel mirrors and each of the plurality of image-side Fresnel mirrors is an outward facing parabolic reflection surface.

20. The vehicle of claim 16, wherein light from the object positioned on the exterior of the vehicle propagates to within the interior of the vehicle to form the image via an optical path:

object—plurality of object-side Fresnel mirrors—inward facing mirror surface of the planar reflection boundary—plurality of image-side Fresnel mirrors—image.

\* \* \* \* \*